United States Patent
Nguyen et al.

(10) Patent No.: US 10,592,619 B1
(45) Date of Patent: Mar. 17, 2020

(54) SIMULATING MICRO-PROPPANT FLOW THROUGH MICROFRACTURES

(71) Applicant: Halliburton Energy Services, Inc., Houston, TX (US)

(72) Inventors: Philip D. Nguyen, Houston, TX (US); Loan K. Vo, Houston, TX (US); Janette Cortez Montalvo, Porter, TX (US); Ruslan Gashimov, Humble, TX (US); James William Ogle, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 384 days.

(21) Appl. No.: 15/210,504

(22) Filed: Jul. 14, 2016

(51) Int. Cl.
  *G06F 17/50* (2006.01)
  *E21B 43/267* (2006.01)

(52) U.S. Cl.
  CPC ........ *G06F 17/5009* (2013.01); *E21B 43/267* (2013.01)

(58) Field of Classification Search
  CPC .............................. G06F 17/5009; E21B 43/267
  See application file for complete search history.

(56) References Cited

U.S. PATENT DOCUMENTS

| | | | | |
|---|---|---|---|---|
| 4,791,822 A | * | 12/1988 | Penny ................... | E21B 43/267 73/38 |
| 4,848,145 A | * | 7/1989 | Blaschke ............... | E21B 43/267 73/152.55 |
| 5,324,956 A | * | 6/1994 | Fagan ..................... | G01P 5/001 250/227.16 |
| 8,286,514 B2 | * | 10/2012 | Anschutz ........... | G01N 15/0806 73/865.6 |
| 2016/0178529 A1 | * | 6/2016 | Shampine .............. | G01N 21/85 356/246 |

OTHER PUBLICATIONS

Pongthunya, P., "Development, Setup and Testing of a Dynamic Hydraulic Fracture Conductivity Apparatus" Thesis Texas A&M University, pp. 1-69, Aug. 2007 (retrieved from Internet at oaktrust.library.tamu.edu) (Year: 2007).*
Parton et al., "New Optimized Laboratory Testing Methods to Study the Effectivenes of Surface Modification Agents," AADE-14-FTCE-01 Fluids Technical Conference, pp. 1-13 (2014) (Year: 2014).*

* cited by examiner

*Primary Examiner* — Rehana Perveen
*Assistant Examiner* — Steven W Crabb
(74) *Attorney, Agent, or Firm* — Locke Lord LLP

(57) ABSTRACT

A conductivity cell for simulating micro-proppant flowing through microstructures includes a core wafer holder defining a fluid inlet and a fluid outlet, with a core wafer chamber connecting the fluid inlet in fluid communication with the fluid outlet. A core wafer is installed within the core wafer chamber of the core wafer holder. A pressure piston is biased against the core wafer within the core wafer chamber. A pre-determined channel gap is defined on the core wafer for passage of the fluid through the cell.

20 Claims, 3 Drawing Sheets

SIMULATING MICRO-PROPPANT FLOW THROUGH MICROFRACTURES

BACKGROUND OF THE INVENTION

1. Field of the Invention

The present disclosure relates to micro-proppants such as used in extracting oil and gas from natural formations, and more particularly to simulation of micro-proppant flow through natural fractures or induced secondary fractures in unconventional reservoir formations.

2. Description of Related Art

Micro-proppants can be used in the oil and gas industry to prop open fractures and microfractures in an oil/gas bearing formation. A fluid containing suspend micro-proppant particles can be injected into a formation to place the micro-proppant particles in the microfractures.

Flow cells with split gaps have been used to simulate the flow of micro-proppants through microfractures. Testing micro-proppants in such devices allows for some level of estimation of how a given micro-proppant will perform in a real formation. However, the results from such simulations may vary from actual micro-proppant performance in a real formation.

Such conventional methods and systems have generally been considered satisfactory for their intended purpose. However, there is still a need in the art for improved simulation of micro-proppant flow through microfractures. The present disclosure provides a solution for this need.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
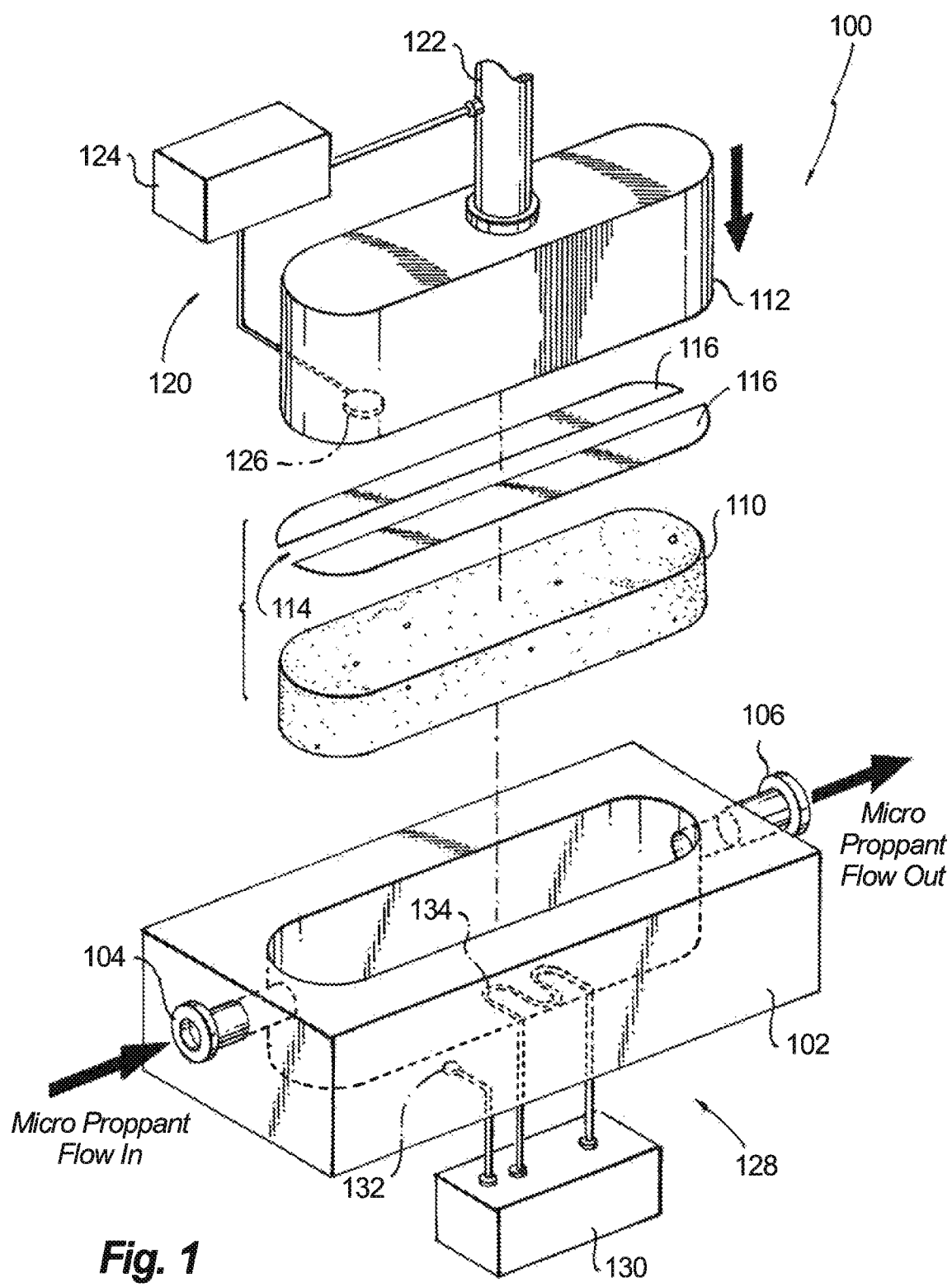
FIG. 1 is an exploded perspective view of an exemplary embodiment of a conductivity cell for simulating micro-proppant flowing through microstructures constructed in accordance with the present disclosure, showing the core wafer separated from the core wafer holder.

Reference will now be made to the drawings wherein like reference numerals identify similar structural features or aspects of the subject disclosure. For purposes of explanation and illustration, and not limitation, a partial view of an exemplary embodiment of a conductivity cell for simulating micro-proppant flowing through microstructures in accordance with the disclosure is shown in FIG. 1 and is designated generally by reference character 100. Other embodiments of conductivity cells in accordance with the disclosure or aspects thereof, are provided in FIGS. 2-4, as will be described. The systems and methods described herein can be used for simulating flow and placement of micro-proppant in microfractures of real formations, e.g., for use in extracting oil and or gas from a subterranean formation.

Figure 2:
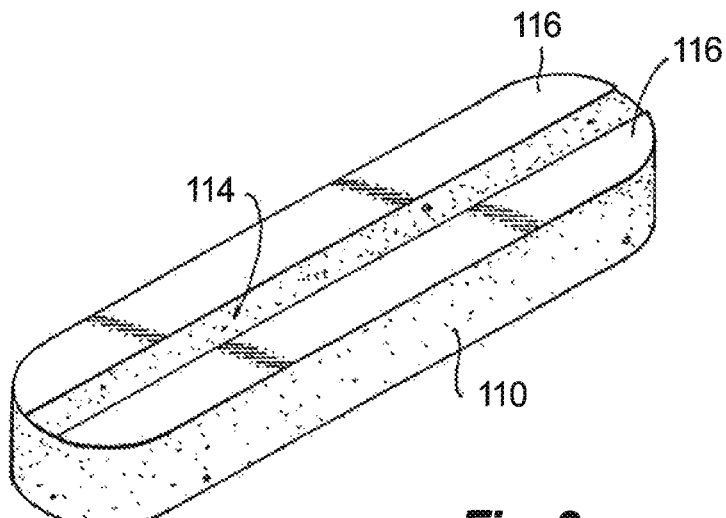
FIG. 2 is a perspective view of a portion of the conductivity cell of FIG. 1, showing the gap channel defined on one surface of the core wafer.

A conductivity cell 100 includes a core wafer holder 102 defining a fluid inlet 104 and a fluid outlet 106. A core wafer chamber 108 connects the fluid inlet 104 in fluid communication with the fluid outlet 106. A core wafer 110 is installed within the core wafer chamber 108 of the core wafer holder 102. A pressure piston 112 is biased against the core wafer 110 within the core wafer chamber 108. A pre-determined channel gap 114 is defined on the core wafer 110 for passage of the fluid through the core wafer chamber 108. The channel gap 114 can be defined by one or more leaflets or sheets 116 mounted to the core wafer 110, as shown in FIG. 2, where two sheets 116 are mounted lengthwise along the top surface of the core wafer 110 leaving the channel gap 114 in between the two sheets 116. Metal sheets 116 or leaflets can be measured and trimmed to meet designed dimensions of a core wafer 110 before mounting and attaching onto the core wafer 110 with a thin film of glue, for example.

Figure 3:
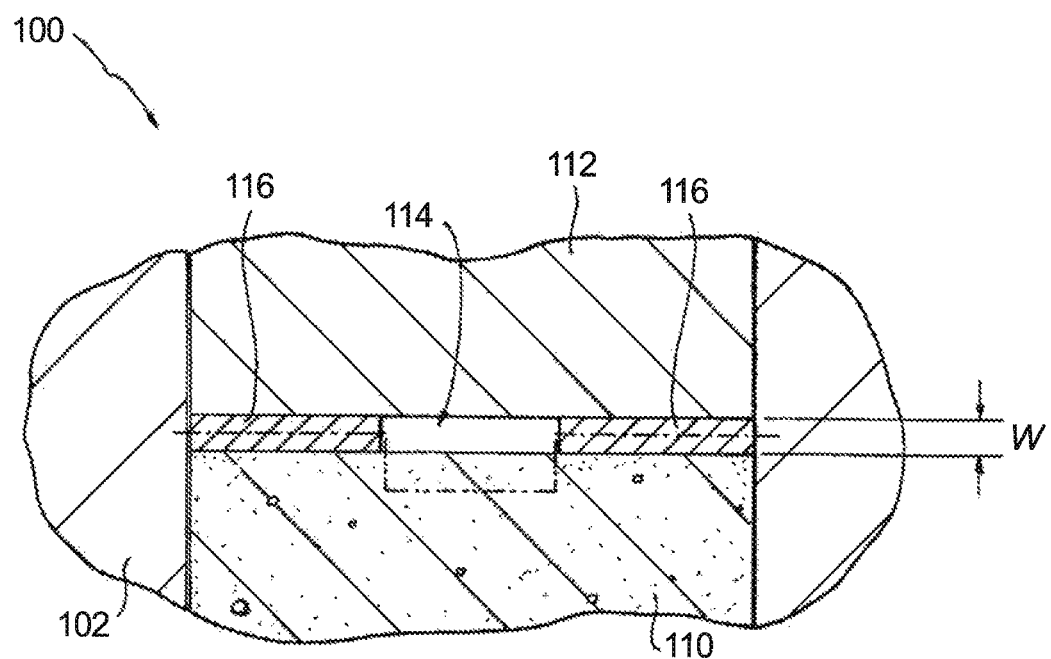
FIG. 3 is a schematic cross-sectional view of a portion of the conductivity cell of FIG. 1, showing the gap channel width exaggerated for sake of clarity.
Figure 4:
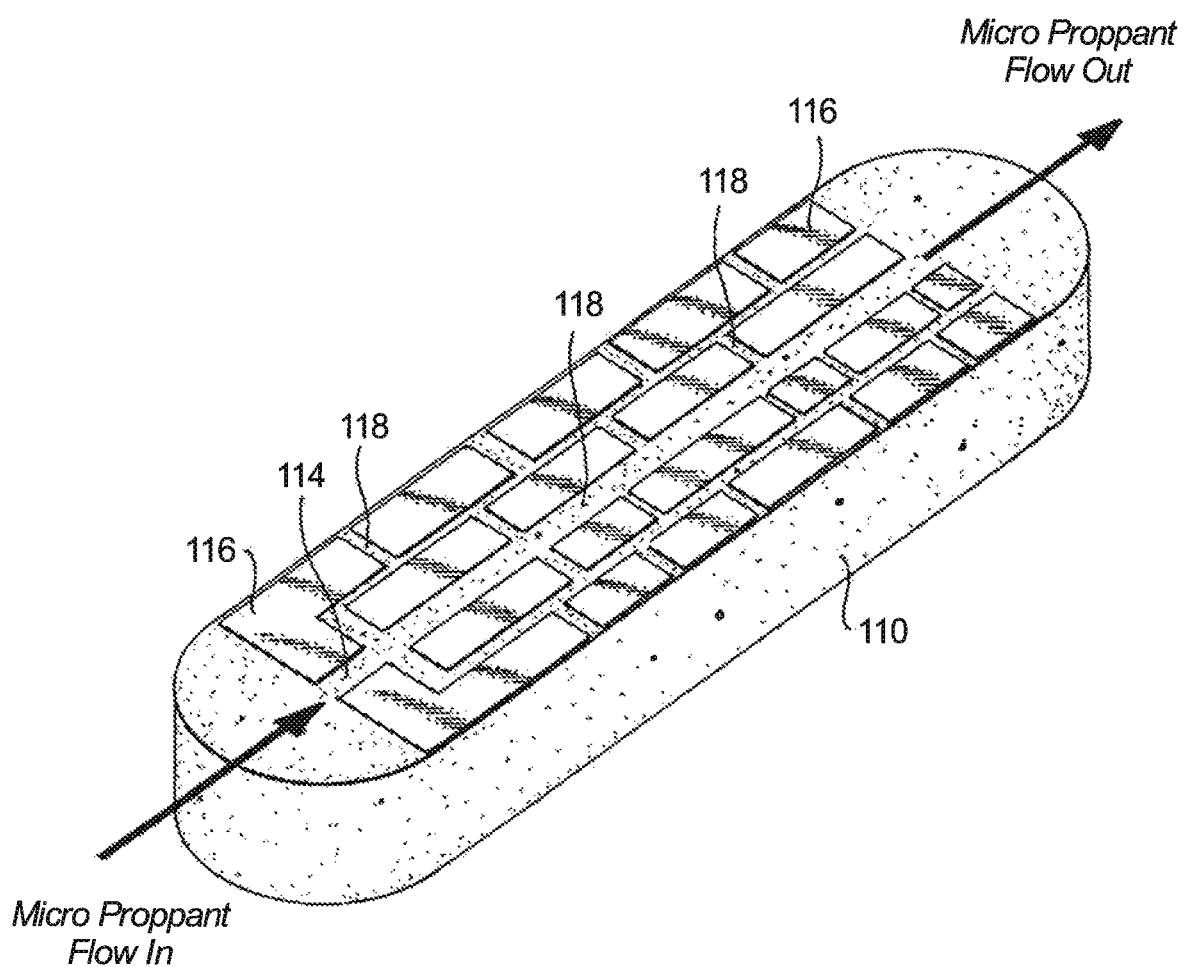
FIG. 4 is a schematic perspective view of another exemplary embodiment of a gap channel defined in a core wafer in accordance with the present disclosure.

With reference to FIG. 3, the channel gap 114 is shown when conductivity cell 100 is assembled. The channel gap 114 can have a width W of 50 to 100 microns width, or any other suitable width for simulating a natural microfracture or other microstructure. The channel gap 114 is a single, straight channel leading directly from inlet 104 to outlet 106, as shown in FIG. 1. As shown in FIG. 4, it is also contemplated that the channel gap 114 can be configured to simulate a complex fracture network including multiple sub-channels 118. The flow of micro-proppant into the channel gap 114 from the inlet 104 of FIG. 1 is indicated in FIG. 4 by the large arrow pointing and the channel gap 114, and the flow of micro-proppant out of the channel gap 114 is indicated in FIG. 4 by the large arrow pointed out from the channel gap 114. Similar arrows are included in FIG. 1 to show the flow into the inlet 104 and out of the outlet 106.

The channel gap 114 can be defined by one or more metallic leaflets 116 including aluminum, stainless steel, copper, silver, nickel, ceramic, composite elastomer, or any other suitable metallic material. It is also contemplated that any other suitable material such as plastic can be used for the leaflets or sheets 116. The sheet or leaflet thickness can be controlled by using a sheets or leaflets of a predetermined thickness, e.g., custom rolled thickness. The channel pattern, e.g., the sub-channels 118 in FIG. 4, can be formed in the leaflets or sheets 116 using any suitable process such as laser cutting. It is also contemplated that the channel gap 114 can be defined by folding or stacking a number of leaflets or sheets 116. The dashed lines running into the sheet 116 in FIG. 3 indicate where two stacked or folded leaflets or sheets 116 could be stacked to form channel gap 114 between core wafer 110 and pressure piston 112. Various patterns of flow channels can also be formed on leaflet or sheet 116 as shown in FIG. 3 by various techniques (e.g., precision cutting, laser cutting, or the like) before installing on the core wafer 110. It is also contemplated that in addition to or in lieu of leaflets or sheets 116, the channel gap 114 can be etched or scored into a surface of the core wafer 110, as indicated in FIG. 3 by the dashed lines running into core wafer 110.

The core wafer 110 can include at least one of a metal, a sandstone material, e.g. Ohio Sandstone, or a shale material. Use of such materials simulates the conditions found in actual formations, including simulating surface interactions such as embedment and incompatibility. At least one of the core wafer 110 and/or the core wafer holder 102 can be made of a transparent material such as Poly(methyl methacrylate) (PMMA) to allow observation of the micro-proppant flowing through the channel gap 114 in real time during a test or after completion of a test.

Referring again to FIG. 1, the conductivity cell 100 can include a pressure control loop 120 operatively connected to control the pressure piston 112 to provide a predetermined pressure to the channel gap 114. The pressure control loop 120 includes an actuator 122 for biasing the pressure piston 112 towards the core wafer 110 to simulate closure pressure on the simulated microfracture that is channel gap 114. A pressure controller 124 and pressure sensor 126 are operatively connected to the actuator 122 and the pressure piston 122 to provide feedback and control signals to maintain a predetermined pressure on the channel gap 114. Similarly, a temperature control loop 128 is operatively connected to the core wafer holder 102 to control temperature within the channel gap 114 to provide a predetermined temperature in the channel gap 114. The temperature control loop includes a temperature controller 130, a temperature sensor 132, and a heater 134 operatively connected to one another to maintain the predetermined temperature in channel gap 114. Those skilled in the art will readily appreciate that the controllers 124 and 130 can be separate as depicted in FIG. 1, or can be combined in a single control system without departing from the scope of this disclosure. The use of control loops 120 and 128 allows for simulation of realistic and/or natural pressure and temperature conditions to which micro-proppants are exposed in real formations.

EXAMPLE

Slickwater solutions containing 0.05 ppg of N-200 Zeeospheres micro-proppant (which has a cumulative 50% point of diameter of 5 microns) were injected through conductivity cells as described herein containing Ohio sandstone wafers that were mounted with aluminum foil leaflets as shown in FIG. 2. Two different thicknesses of aluminum foil were used, 16 micron and 24 micron. A backpressure of 300 psi was set for all cells. A constant flow rate of 50 mL/minute was applied with a pump to inject fluid through the cell. It was observed that there was negligible variation of injection pressure during injection, indicating that bridging of micro-proppant particulates did not occur while flowing through the gap between the wafers. During the test, the produced fluid with micro-proppant from each cell was collected. After drying, the amount of micro-proppant allowed to go through each test was measured for comparison between tests, and the results are shown in Table 1. The use of 24 micron aluminum foil resulted in a wider channel gap width, thus slightly more proppant was collected.

TABLE 1

Measurement of Micro-proppant Flowed Through Cell

| Cell | Foil Type | Micro-proppant, grams |
|---|---|---|
| 1 | 24 micron | 3.28 |
| 2 | 24 micron | 3.26 |
| 3 | 16 micron | 3.03 |
| 4 | 16 micron | 3.08 |

A method of simulating micro-proppant flowing through and placement of micro-proppant within microstructures includes injecting a fluid including micro-proppant through a conductivity cell, e.g., injecting the fluid through the inlet 104 of the conductivity cell 100. The conductivity cell includes a core wafer, e.g. the core wafer 110, wherein a pre-determined channel gap, e.g., the channel gap 114, is defined on the core wafer for passage of the fluid through the cell. The method also includes measuring pressure drop across flow through the conductivity cell, e.g., measuring pressure drop between the inlet 104 and the outlet 106 of the conductivity cell 100. The method can include controlling at least one of closure pressure on the channel gap or temperature within the channel gap to simulate natural conditions in a formation, e.g. using the control loops 120 and/or 128.

While shown and described in the exemplary context of using a single core wafer 110 and channel gap 114, those skilled in the art will readily appreciate that multiple core wafers 110 with respective channel gaps 114 can be stacked and used within a conductivity cell 100 without departing from the scope of this disclosure.

Accordingly, as set forth above, the embodiments disclosed herein may be implemented in a number of ways. For example, in general, in one aspect, the disclosed embodiments relate to a conductivity cell for simulating micro-proppant flowing through microstructures. The conductivity cell includes a core wafer holder defining a fluid inlet and a fluid outlet, with a core wafer chamber connecting the fluid inlet in fluid communication with the fluid outlet. A core wafer is installed within the core wafer chamber of the core wafer holder. A pressure piston is biased against the core wafer within the core wafer chamber. A pre-determined channel gap is defined on the core wafer for passage of the fluid through the core wafer chamber.

The conductivity cell can include at least one of a pressure control loop operatively connected to control the pressure piston to provide a predetermined pressure to the channel gap and/or a temperature control loop operatively connected to control temperature within the channel gap to provide a predetermined temperature in the channel gap.

The channel gap can have a width simulating a natural microfracture at 5 to 1,000 microns width. The channel gap can be configured to simulate a complex fracture network including multiple sub-channels. The channel gap can be defined by one or more leaflets or sheets mounted to the core wafer. The channel gap can be defined by one or more metallic leaflets of at least one of aluminum, stainless steel, copper, silver, nickel, ceramic, or composite elastomer. The channel gap can be defined by one or more plastic leaflets or sheets. The channel gap can be defined by folding, stacking, precision cutting, or laser cutting a number of leaflets or sheets. It is also contemplated that the channel gap can be etched or scored into a surface of the core wafer.

The core wafer can include at least one of a metal, a sandstone, or a shale material. At least one of the core wafer or the core wafer holder holding the core wafer can be made of a transparent material such as PMMA.

A method of simulating micro-proppant flowing through microstructures includes injecting a fluid including micro-proppant through a conductivity cell. The conductivity cell includes a core wafer wherein a pre-determined channel gap is defined on the core wafer for passage of the fluid through the cell. The method also includes measuring flow rate, pressure drop across flow through the conductivity cell, and concentrations of micro-proppant contained in the collected effluents.

The method can include controlling at least one of closure pressure on the channel gap or temperature within the channel gap to simulate natural conditions in a formation.

The methods and systems of the present disclosure, as described above and shown in the drawings, provide for simulation of micro-proppant through microfractures in natural formations with superior properties including improved simulation of natural formation conditions. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of simulating micro-proppant flowing through microstructures comprising:
   injecting a fluid including micro-proppant through a conductivity cell, wherein the conductivity cell includes a core wafer wherein a plurality of pre-determined channel gaps are defined on the core wafer for passage of the fluid through the conductivity cell, wherein the channel gaps are defined between a plurality of leaflets or sheets, the leaflets or sheets being arranged lengthwise along the core wafer in at least four rows with gaps arranged between the leaflets or sheets in each row such that sub-channels are defined running widthwise across the core wafer, and wherein the plurality of leaflets or sheets are bounded by the core wafer; and
   measuring pressure drop across flow through the conductivity cell.

2. A method as recited in claim 1, wherein the channel gaps have a width simulating a natural microfracture at 5 to 1,000 microns width.

3. A method as recited in claim 1, wherein the leaflets or sheets are mounted to the core wafer.

4. A method as recited in claim 3, wherein the leaflets or sheets are plastic.

5. A method as recited in claim 3, wherein the channel gaps are defined by folding, stacking, precision cutting, or laser cutting a number of leaflets or sheets.

6. A method as recited in claim 1, wherein the core wafer includes at least one of metal, a sandstone, or a shale material.

7. A method as recited in claim 1, wherein at least one of the core wafer and a core holder holding the core wafer is made of a transparent material including poly(methylmethacrylate) (PMMA).

8. A method as recited in claim 1, further comprising controlling at least one of closure pressure on the channel gaps or temperature within the channel gaps to simulate natural conditions in a formation.

9. A method as recited in claim 1, wherein the plurality of leaflets or sheets include rectangular leaflets or sheets.

10. A conductivity cell for simulating micro-proppant flowing through microstructures comprising:
    a core wafer holder defining a fluid inlet and a fluid outlet, with a core wafer chamber connecting the fluid inlet in fluid communication with the fluid outlet;
    a core wafer installed within the core wafer chamber of the core wafer holder; and
    a pressure piston biased against the core wafer within the core wafer chamber, wherein a plurality of pre-determined channel gaps are defined on the core wafer for passage of the fluid through the core wafer chamber, wherein the channel gaps are defined between a plurality of leaflets or sheets, the leaflets or sheets being arranged lengthwise along the core wafer in at least four rows with gaps arranged between the leaflets or sheets in each row such that sub-channels are defined running widthwise across the core wafer, and wherein the plurality of leaflets or sheets are bounded by the core wafer.

11. A conductivity cell as recited in claim 10, further comprising at least one of a pressure control loop operatively connected to control the pressure piston to provide a predetermined pressure to the channel gaps; or
    a temperature control loop operatively connected to control temperature within the channel gaps to provide a predetermined temperature in the channel gaps.

12. A conductivity cell as recited in claim 11, wherein the channel gaps have a width simulating a natural microfracture at 5 to 1,000 microns width.

13. A conductivity cell as recited in claim 11, wherein the leaflets or sheets are mounted to the core wafer.

14. A conductivity cell as recited in claim 13, wherein the leaflets or sheets are metallic leaflets of at least one of aluminum, stainless steel, copper, silver, nickel, ceramic, or composite elastomer.

15. A conductivity cell as recited in claim 13, wherein the leaflets or sheets are plastic.

16. A conductivity cell as recited in claim 13, wherein the channel gaps are defined by folding, stacking, precision cutting, or laser cutting a number of leaflets or sheets.

17. A conductivity cell as recited in claim 11, wherein the channel gaps are configured to simulate a complex fracture network including multiple sub-channels.

18. A conductivity cell as recited in claim 11, wherein the core wafer includes at least one of a metal, a sandstone or a shale material.

19. A conductivity cell as recited in claim 11, wherein at least one of the core wafer or the core wafer holder is made of a transparent material including poly(methyl methacrylate) (PMMA).

20. A conductivity cell as recited in claim 11, wherein the plurality of leaflets or sheets include rectangular leaflets or sheets.

* * * * *